United States Patent
Sun

(10) Patent No.: US 10,140,930 B2
(45) Date of Patent: Nov. 27, 2018

(54) SIGNAL GENERATING UNIT, SHIFT REGISTER, DISPLAY DEVICE AND SIGNAL GENERATING METHOD

(71) Applicant: BOE Technology Group Co., Ltd., Beijing (CN)

(72) Inventor: Tuo Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/537,799

(22) PCT Filed: May 11, 2016

(86) PCT No.: PCT/CN2016/081635
§ 371 (c)(1),
(2) Date: Jun. 19, 2017

(87) PCT Pub. No.: WO2017/140041
PCT Pub. Date: Aug. 24, 2017

(65) Prior Publication Data
US 2018/0047344 A1    Feb. 15, 2018

(30) Foreign Application Priority Data
Feb. 18, 2016    (CN) .......................... 2016 1 0091556

(51) Int. Cl.
*G09G 3/34*    (2006.01)
*G11C 19/28*    (2006.01)
(Continued)

(52) U.S. Cl.
CPC ............. *G09G 3/34* (2013.01); *G11C 19/184* (2013.01); *G11C 19/186* (2013.01); *G11C 19/28* (2013.01);
(Continued)

(58) Field of Classification Search
None
See application file for complete search history.

(56) References Cited

U.S. PATENT DOCUMENTS 8,054,935 B2 * 11/2011 Tsai ..................... H03K 19/096
377/64
8,823,620 B2 * 9/2014 Kimura .......... H03K 19/018507
345/92
(Continued)

FOREIGN PATENT DOCUMENTS

CN    101707043 A    5/2010
CN    103280200 A    9/2013
(Continued)

OTHER PUBLICATIONS

Aug. 11, 2017—(CN) First Office Action 201610091556.5 with Eng Tran.
(Continued)

*Primary Examiner* — Dorothy Harris
(74) *Attorney, Agent, or Firm* — Banner & Witcoff, Ltd.

(57) ABSTRACT

A signal generating unit, a shift register, a display device and a signal generating method. The signal generating unit includes: a first output transistor; a second output transistor; a first-node potential control module, configured to output a first control signal to a gate electrode of the first output transistor under control of an inputted start signal; a second-node potential control module configured to output a second control signal, which has an opposite phase with the first control signal, to a gate electrode of the second output transistor; and a first capacitor structure configured to be charged when the first-node potential control module outputs a single-pulse-width level signal for controlling the first output transistor to be switched on, and to maintain the gate (Continued)

electrode of the first output transistor in an on state during a subsequent time period having one pulse width.

15 Claims, 13 Drawing Sheets

(51) Int. Cl.
    *G11C 19/18*     (2006.01)
    *H03K 17/10*     (2006.01)

(52) U.S. Cl.
    CPC ... *H03K 17/102* (2013.01); *G09G 2300/0408* (2013.01); *G09G 2310/0286* (2013.01)

(56) References Cited

U.S. PATENT DOCUMENTS

| | | | |
|---|---|---|---|
| 2006/0202940 A1 | 9/2006 | Azami et al. | |
| 2007/0040771 A1* | 2/2007 | Chung | G11C 19/00 345/76 |
| 2007/0063933 A1* | 3/2007 | Chung | G09G 3/3266 345/76 |
| 2008/0030439 A1* | 2/2008 | Shin | G09G 3/3266 345/82 |
| 2010/0188316 A1* | 7/2010 | Jang | G09G 3/3266 345/76 |
| 2010/0207968 A1* | 8/2010 | Kim | G09G 3/3266 345/691 |
| 2011/0102398 A1* | 5/2011 | Han | H03K 3/356139 345/209 |
| 2011/0285752 A1* | 11/2011 | Park | G09G 3/3225 345/690 |
| 2012/0038609 A1* | 2/2012 | Chung | G09G 3/003 345/211 |
| 2013/0322592 A1* | 12/2013 | Miyake | G11C 19/184 377/64 |
| 2016/0372041 A1* | 12/2016 | Sun | G09G 3/20 |
| 2017/0154602 A1* | 6/2017 | Sun | G09G 5/003 |
| 2017/0330633 A1* | 11/2017 | Sun | G11C 19/186 |

FOREIGN PATENT DOCUMENTS

| | | |
|---|---|---|
| CN | 103700357 A | 4/2014 |
| CN | 104134425 A | 11/2014 |
| CN | 104332127 A | 2/2015 |
| CN | 104485065 A | 4/2015 |
| CN | 104537980 A | 4/2015 |
| CN | 104882168 A | 9/2015 |
| CN | 105047124 A | 11/2015 |
| CN | 105529000 A | 4/2016 |
| JP | 2014010864 A | 1/2014 |

OTHER PUBLICATIONS

Nov. 14, 2016—International Search Report and Written Opinion Appn PCT/CN2016/081635 with Eng Tran.

\* cited by examiner

SIGNAL GENERATING UNIT, SHIFT REGISTER, DISPLAY DEVICE AND SIGNAL GENERATING METHOD

The application is a U.S. National Phase Entry of International Application No. PCT/CN2016/081635 filed on May 11, 2016, designating the United States of America and claiming priority to Chinese Patent Application No. 201610091556.5 filed on Feb. 18, 2016. The present application claims priority to and the benefit of the above-identified applications and the above-identified applications are incorporated by reference herein in their entirety.

TECHNICAL FIELD

Embodiments of the present disclosure relate to a signal generating unit, a shift register, a display device and a signal generating method in the field of display technologies.

BACKGROUND

With a higher and higher requirement of display devices on grayscale, control of the grayscales of the display devices by relying solely on data signals currently has the following problems:

1. When grayscales are higher, the difference of data signals corresponding to adjacent grayscales is smaller, and a high cost needs to be paid for the distinction of such a small voltage using a conventional chip.

2. When the difference of the data signals corresponding to the adjacent grayscales is very small, brightness distinction in display cannot be achieved in the case of insufficient response sensitivity of driving transistors. Therefore, when the grayscale of the display device is higher, the requirement on the sensitivity of the driving transistors is higher, causing the requirements on the manufacturing process, materials and the like to be also very high. The cost is also increased.

SUMMARY

Embodiments of the present disclosure provide a signal generating unit, comprising: a first output transistor disposed between an output node and a first power node, the first power node configured for receiving a high-level power supply signal; a second output transistor disposed between the output node and a second power node, the second power node configured for receiving a low-level power supply signal; a first-node potential control module, configured to output a first control signal to a gate electrode of the first output transistor under control of an inputted start signal; a second-node potential control module configured to output a second control signal, which has an opposite phase with the first control signal, to a gate electrode of the second output transistor; and a first capacitor structure connected with the gate electrode of the first output transistor, and configured to be charged when the first-node potential control module outputs a single-pulse-width level signal for controlling the first output transistor to be switched on, and to maintain the gate electrode of the first output transistor in an on state during a subsequent time period having one pulse width.

Embodiments of the disclosure provides a shift register, comprising a plurality of signal generating units described above, where the plurality of signal generating units are in cascade connection to form the shift register, and in adjacent signal generating units, a gate electrode of a first output transistor in a former signal generating unit is connected with a start signal input node of a latter signal generating unit.

Embodiments of the disclosure provides a display device, comprising a plurality of pixel structures disposed in a display region, where each pixel structure includes a driving transistor, a power supply signal input node, a luminescent device and a power supply control transistor disposed between the power supply signal input node and the luminescent device, and the display device further comprises the shift register described above, and an output node of each signal generating unit in the shift register is connected with a gate electrode of a driving transistor in a corresponding pixel structure Embodiments of the disclosure provides a signal generating method, comprising:

outputting a first control signal to a gate electrode of a first output transistor under control of a start signal, and outputting a second control signal, which has an opposite phase with the first control signal, to a gate electrode of a second output transistor, wherein the first output transistor is disposed between an output node and a first power node for receiving a high level power supply signal, and the second output transistor is disposed between the output node and a second power node for receiving a low level power supply signal; and charging a first capacitor structure when the first control signal is a single-pulse-width level signal for controlling the first output transistor to be switched on, so that the charged first capacitor structure maintains the gate electrode of the first output transistor in an on state during a subsequent time period having a duration of one pulse width.

BRIEF DESCRIPTION OF THE DRAWINGS

In order to illustrate the technical solutions in the embodiments of the present disclosure or the existing arts more clearly, the drawings need to be used in the description of the embodiments or the existing arts will be briefly described in the following; it is obvious that the drawings described below are only related to some embodiments of the present disclosure, for one ordinary skilled person in the art, other drawings can be obtained according to these drawings without making other inventive work.

DETAILED DESCRIPTION

The technical solutions of the embodiments of the present disclosure will be described in a clearly and fully understandable way in connection with the drawings related to the embodiments of the disclosure. It is obvious that the described embodiments are just a part but not all of the embodiments of the present disclosure. Based on embodiments of the present disclosure, all other embodiments obtained by those skilled in the art without making other inventive work should be within the scope of the present disclosure.

Figure 1:
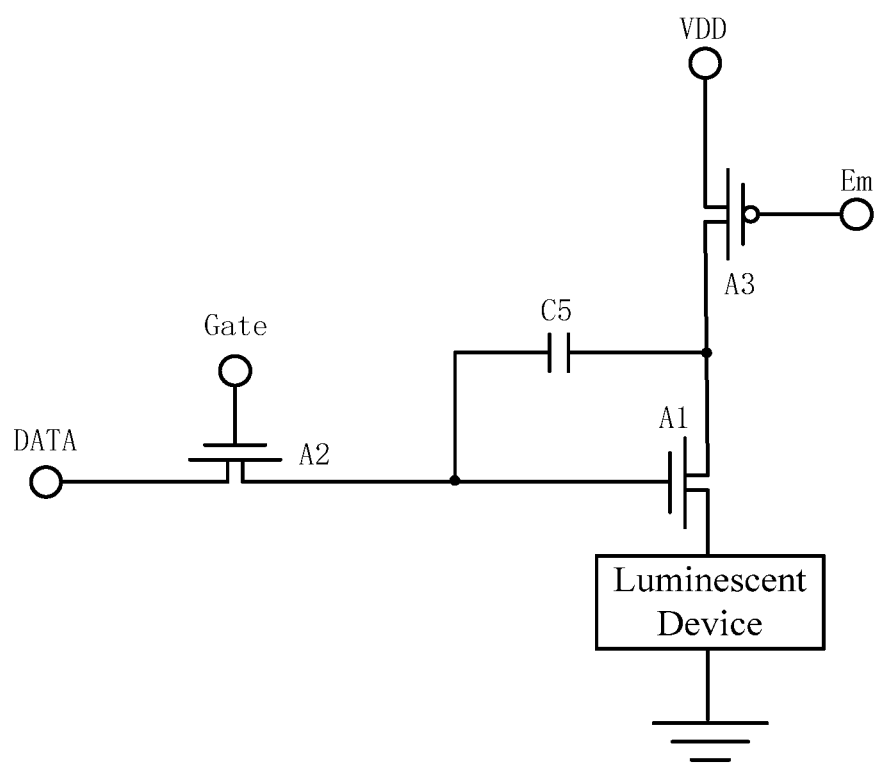
FIG. 1 is a schematic diagram of a pixel structure having a current-driven or voltage-driven luminescent device.

In a pixel structure having a current-driven or voltage-driven luminescent device as shown in FIG. 1, in a scanning period, a gate-electrode control signal Gate controls a scanning transistor A2 to be switched on, so that a data signal DATA can be inputted into a control end of a driving transistor A1 and charge a capacitor structure C5; subsequently, a conduction degree of the driving transistor A1 is controlled by utilization of power stored in the capacitor structure C5; and hence the current of the luminescent device can be controlled.

As shown in FIG. 1, an Em signal needs to maintain the conduction of a power supply control transistor A3 in an entire emission period, so as to ensure the emission of the luminescent device. In general, considering a factor of power consumption, the power supply control transistor A3 is usually a P-type transistor, that is, the EM signal is a normally low pulse signal.

In related technologies, higher grayscales may be achieved by the combination of the control of the working state of the luminescent device and the control of the current of the luminescent device. For instance, as shown in FIG. 1, in the pixel structure the brightness of the luminescent device revealed to the outside environment depends on two factors: a time span ratio of a luminescent state and a switching-off state, and a brightness under the luminescent state. The brightness under the luminescent state may be controlled by a data signal, and the time span ratio between the luminescent state and the switching-off state may be controlled by a power supply signal. If some high level pulses are inserted at the emission period, when the power supply control transistor A3 is switched off under the control of the high level signals, the power supply signal VDD cannot be applied to a first electrode of the driving transistor A1, so that the luminescent device cannot emit light and is in the switching-off state. That is to say, the brightness of the luminescent device may be controlled by the control of a duty ratio of the Em signal during the emission period. The cooperation of the Em signal and the DATA signal may achieve higher grayscales.

In related technologies, a normally low signal is basically obtained by a reversing processing of a normally high signal. As a pulse width of the normally high signal is identical to a pulse width of a clock signal currently, the duty ratio of the Em signal cannot be flexibly modulated, and hence flexible brightness control cannot be achieved as well.

In the signal generating unit, the shift register, the display device and the signal generating method provided by the embodiments of the present disclosure, due to the existence of a capacitor structure, a start signal STV having one pulse width can maintain the conduction of the driving transistor for the time period of two pulse widths. Thus, a level signal with even multiples of the pulse width and having a phase opposite to that of the start signal STV can be outputted. Thus, a conventional approach that the reversing processing can only obtain a signal with the same pulse width is changed, and then more flexible control of the signal output can be achieved.

Figure 2:
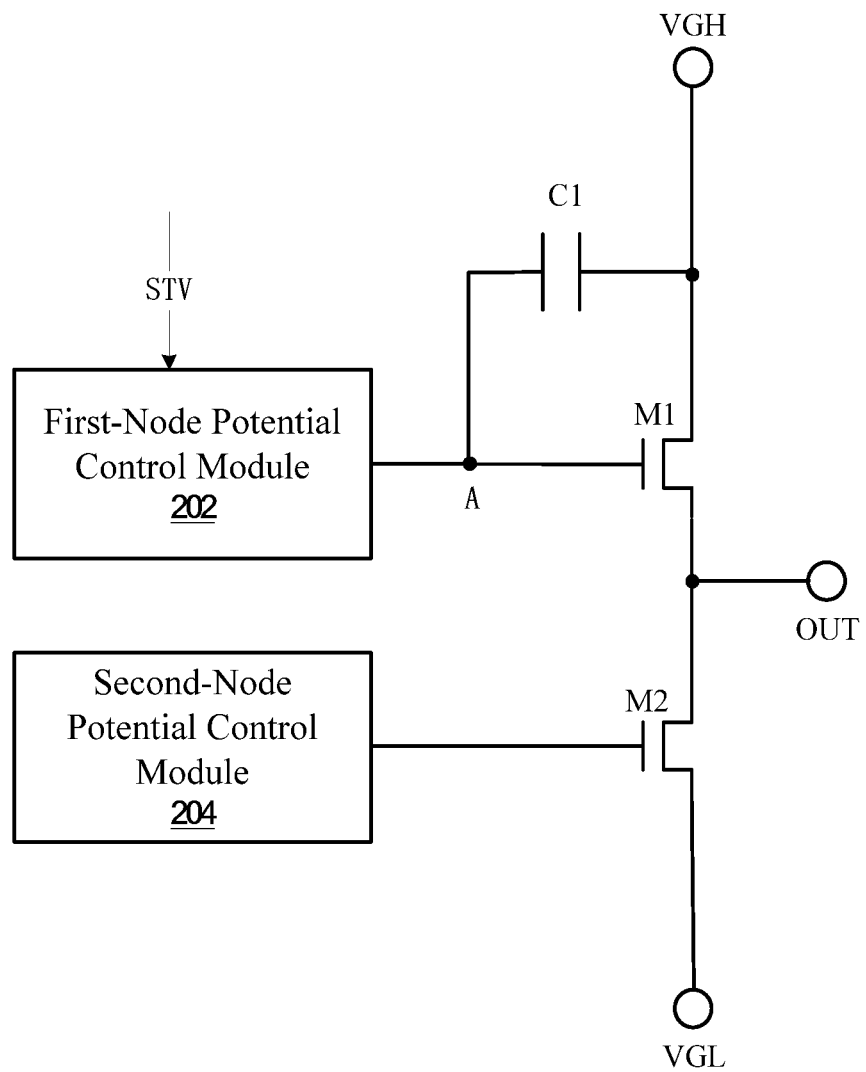
FIG. 2 is a schematic structural view of a signal generating unit provided by an embodiment of the present disclosure.

As shown in FIG. 2, a signal generating unit provided by an embodiment of the present disclosure comprises:

a first output transistor M1 disposed between an output node and a first power node for receiving a high-level power supply signal VGH;

a second output transistor M2 disposed between the output node and a second power node for receiving a low-level power supply signal VGL;

a first-node potential control module 202 configured to output a first control signal to a gate electrode of the first output transistor M1 under the control of a start signal;

a second-node potential control module 204 configured to output a second control signal, which has a phase opposite to that of the first control signal, to a gate electrode of the second output transistor M2; and a first capacitor structure C1, connected with the gate electrode of the first output transistor M1, and configured to be charged when the first-node potential control module outputs a single-pulse-width level signal that is capable of controlling the conduction of the first output transistor M1, and maintain the gate electrode of the first output transistor M1 in an on state within a subsequent time period having a duration of the pulse width.

With reference to FIG. 2, by the arrangement of the first capacitor structure C1, the input of the level signal STV with one pulse width can maintain the conduction of M1 for the time duration of two pulse widths, so that a level signal with two pulse widths and having an opposite phase with the level signal STV can be outputted. Thus, a conventional approach that the reversing processing can only obtain a signal with the same pulse width is changed, so that more flexible control of signal output can be achieved.

It should be understood that: in the embodiments of the present disclosure, the first capacitor structure C1 needs to be charged when the first-node potential control module outputs a level signal with a single pulse width capable of controlling the conduction of the first output transistor M1. One electrode plate of the first capacitor structure C1 is connected with the gate electrode of M1, and the other electrode plate is not limited to be connected with the first power node for receiving the high-level power supply signal VGH as shown in FIG. 2. For instance, the other electrode plate may also be connected with a node capable of providing a high level signal when the first-node potential control module outputs the level signal with the single pulse width for controlling the conduction of M1, so that the voltage difference between the two electrode plates of the capacitor structure can be ensured, and hence C1 can be charged.

When the structure is used for generating the Em signal as shown in FIG. 1, a low level signal with one pulse width can maintain the conduction of the driving transistor for the time period of two pulse widths, so that a high level signal with two pulse widths can be outputted. Thus, the conventional approach that only a normally low signal with the same pulse width can be obtained by the reversing processing of the normally high signal with one pulse width is changed, so that the duty ratio of Em can be more flexibly controlled, and hence the flexibility of brightness control can be improved.

The signal generating unit provided by the embodiments of the present disclosure can implement reversing processing on a normally low signal with a single pulse width to output a normally high signal with two pulse widths, or can implement reversing processing on a normally high signal with a single pulse width to output a normally low signal with two pulse widths. When applying to generate the Em signal in FIG. 1, it belongs to the later case (namely, performing reversing processing on the normally high signal with a single pulse width to output the normally low signal with two pulse widths). In this case, the first output transistor M1 and the second output transistor M2 are transistors which are switched on under low-level control signals; and the level signal with the single pulse width capable of controlling the conduction of the first output transistor M1, outputted by the first-node potential control module, is a low level signal with a single pulse width.

As shown in FIG. 2, in the above case, after the low level signal with the single pulse width is outputted from the first-node potential control module, the first output transistor M1 is controlled to be switched on; the output node OUT outputs a high level signal; and meanwhile, the first capacitor structure C1 is charged under the control of the low level signal and the high-level power supply signal VGH. After the output of the low level signal is ended, the capacitor structure C1 after being charged continuously maintains the low level state of the gate electrode of the first output transistor M1; the first output transistor M1 is continuously switched on; and the output node OUT continuously outputs a high level signal. Thus, signal phase inversion and signal expansion can be simultaneously achieved.

Of course, the embodiments of the present disclosure are not limited to the case of outputting the high level signal with two pulse widths as described above, and may also output a high level signal with any even multiples of the pulse width, described as follows.

Figure 3A:
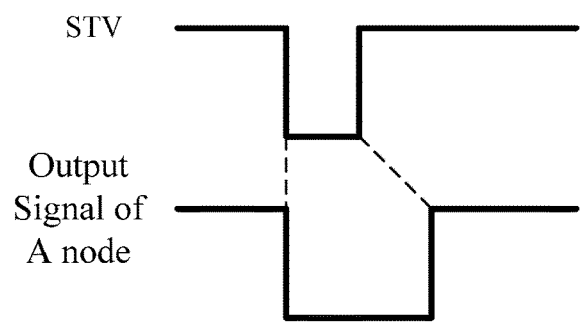
FIGS. 3a to 3d are schematic diagrams illustrating corresponding relationship between different start signals (STV signals) and a potential state of an A node.

Taking the case that the start signal (the STV signal) is a low level signal as an example, as shown in FIG. 3a, the low level signal (the STV signal) with a single pulse width is adopted to achieve the output of a low level signal with two pulse widths at an A node (the low level signal with two pulse widths is outputted from the A node to the gate electrode of M1), and then the output of a high level signal with two pulse widths is achieved at the output node OUT.

Figure 3B:
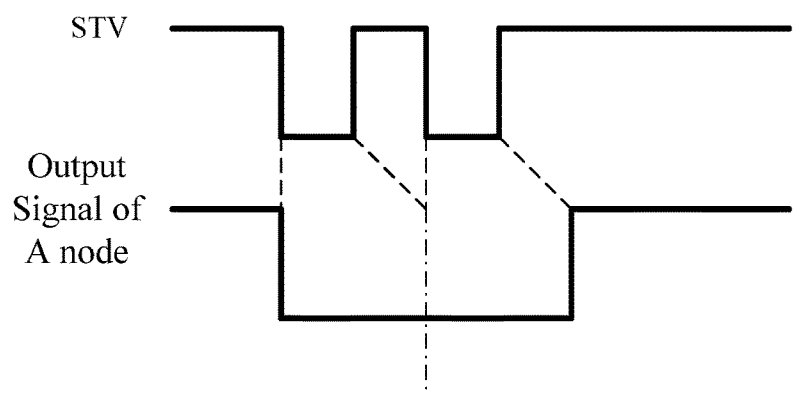

As shown in FIG. 3b, two separate low level signals (STV signals) are adopted to achieve the output of a low level signal with 4 pulse widths at the A node (the low level signal with 4 pulse widths is outputted from the A node to the gate electrode of M1), and then the output of a high level signal with 4 pulse widths is achieved at the output node OUT.

Figure 3C:
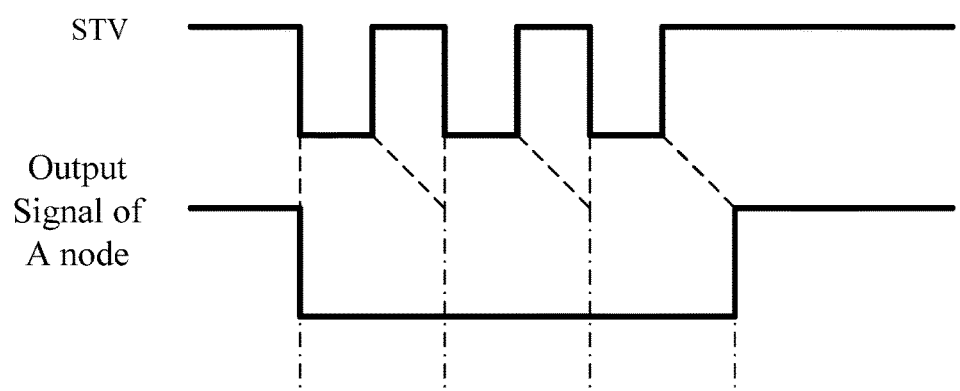

As shown in FIG. 3c, three separate low level signals (STV signals) are adopted to achieve the output of a low level signal with 6 pulse widths at the A node (the low level signal with 6 pulse widths is outputted from the A node to the gate electrode of M1), and then the output of a high level signal with 6 pulse widths is achieved at the output node OUT.

Figure 3D:
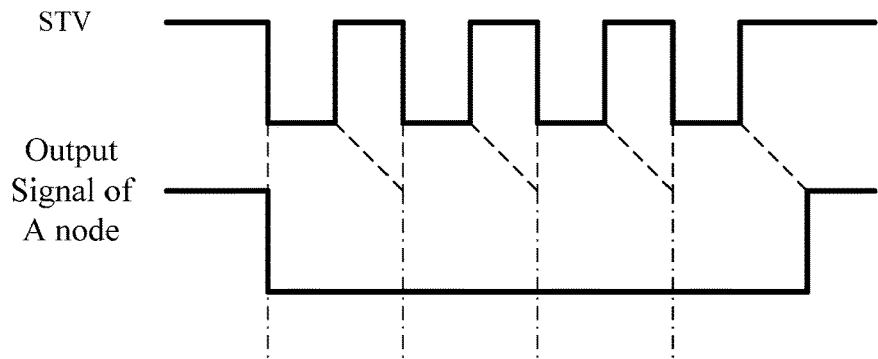

As shown in FIG. 3d, four separate low level signals (STV signals) are adopted to achieve the output of a low level signal with 8 pulse widths at the A node (the low level signal with 8 pulse widths is outputted from the A node to the gate electrode of M1), and then the output of a high level signal with 8 pulse widths is achieved at the output node OUT.

Similarly, n separate low level signals (STV signals) are adopted to achieve the output of a low level signal with 2n pulse widths at the A node (the low level signal with 2n pulse widths is outputted from the A node to the gate electrode of M1), and then the output of a high level signal with 2n pulse widths is achieved at the output node OUT. Further, the low level signal with multiple pulse widths can achieve the flexible control of the duty ratio of the Em signal.

That is to say, in the embodiments of the present disclosure, when the first control signal, which is outputted by the first-node potential control module in the process of processing one frame of data, includes one or more single-pulse-width low level signals (STV signals), and one single pulse width is spaced between adjacent low level signals. For instance, as shown in FIGS. 3b to 3d, when the first control signal includes a plurality of single-pulse-width low level signals, one pulse width is spaced between adjacent low level signals.

In the embodiments of the present disclosure, the first-node potential control module needs to output the first control signal to the gate electrode of the first output transistor M1 under the control of the start signal, and the first control signal includes at least one single-pulse-width level signal capable of controlling the conduction of the first output transistor.

Figure 4:
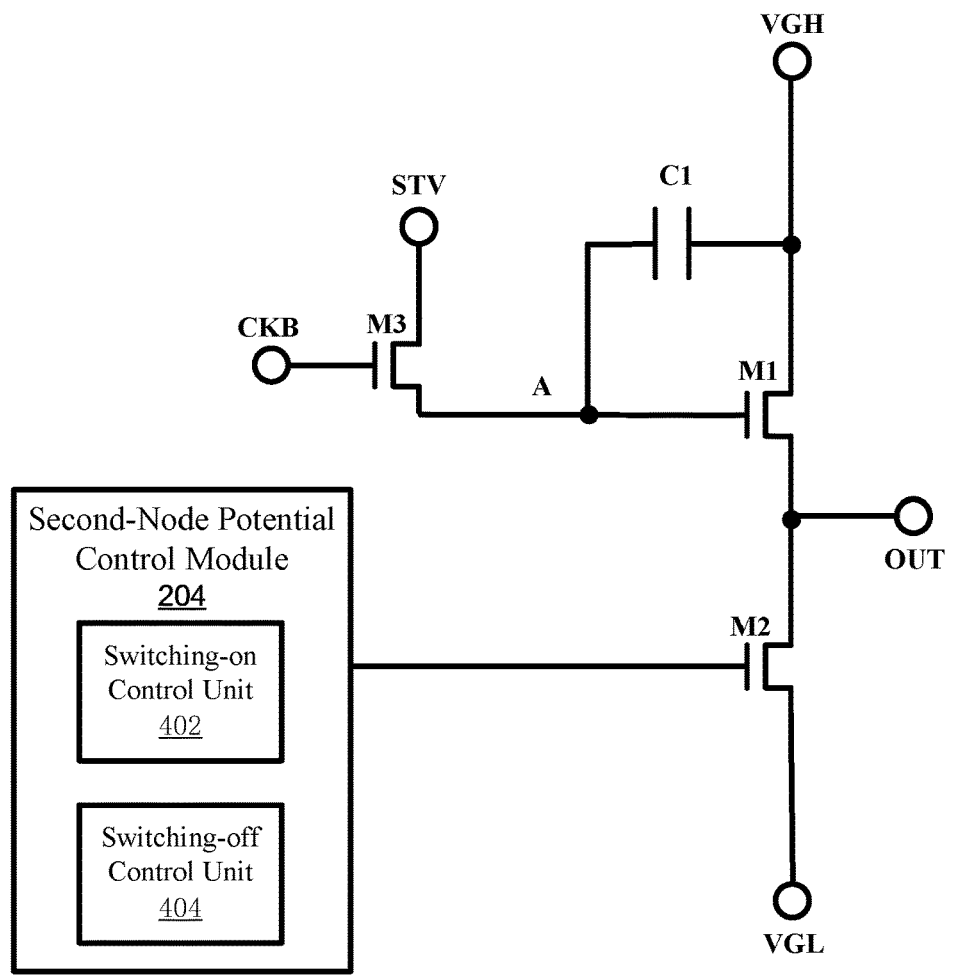
FIG. 4 is a schematic structural view of an example implementation of a first-node potential control module.

As shown in FIG. 4, in an embodiment of the present disclosure, the first-node potential control module is a first potential control transistor M3. A gate electrode of the first potential control transistor M3 is connected with a first clock node for receiving a first clock signal CKB; a first electrode receives the start signal STV including a single-pulse-width low level signal (e.g., a level signal having a single pulse width); and a second electrode is connected with the gate electrode of the first output transistor M1. When the first electrode of the first potential control transistor M3 receives the single-pulse-width low level signal, the first clock signal CKB controls the first potential control transistor M3 to be switched on, so that the second electrode of M3 can output the single-pulse-width low level signal to the gate electrode of the first output transistor M1 to control the first output transistor M1 to be switched on. The output node OUT outputs a high level signal, and meanwhile, the first capacitor structure C1 is charged under the control of the low level signal and the high-level power supply signal VGH.

The second-node potential control module may be configured to provide a second control signal, which has an opposite phase with the first control signal, to the second output transistor M2. Thus, when the first output transistor M1 is switched on, the second output transistor M2 is switched off, and the output node OUT outputs a high level signal. When the first output transistor M1 is switched off, the second output transistor M2 is switched on, and the output node OUT outputs a low level signal.

For instance, the second-node potential control module may include:

a switching-off control unit 402 configured to, when the first output transistor M1 is switched on, output a high level signal to the gate electrode of the second output transistor M2 to switch off the second output transistor M2; and a switching-on control unit 404 configured to, when the first output transistor M2 is switched off, output a low level signal to the gate electrode of the second output transistor M2 to switch on the second output transistor M2.

Figure 5:
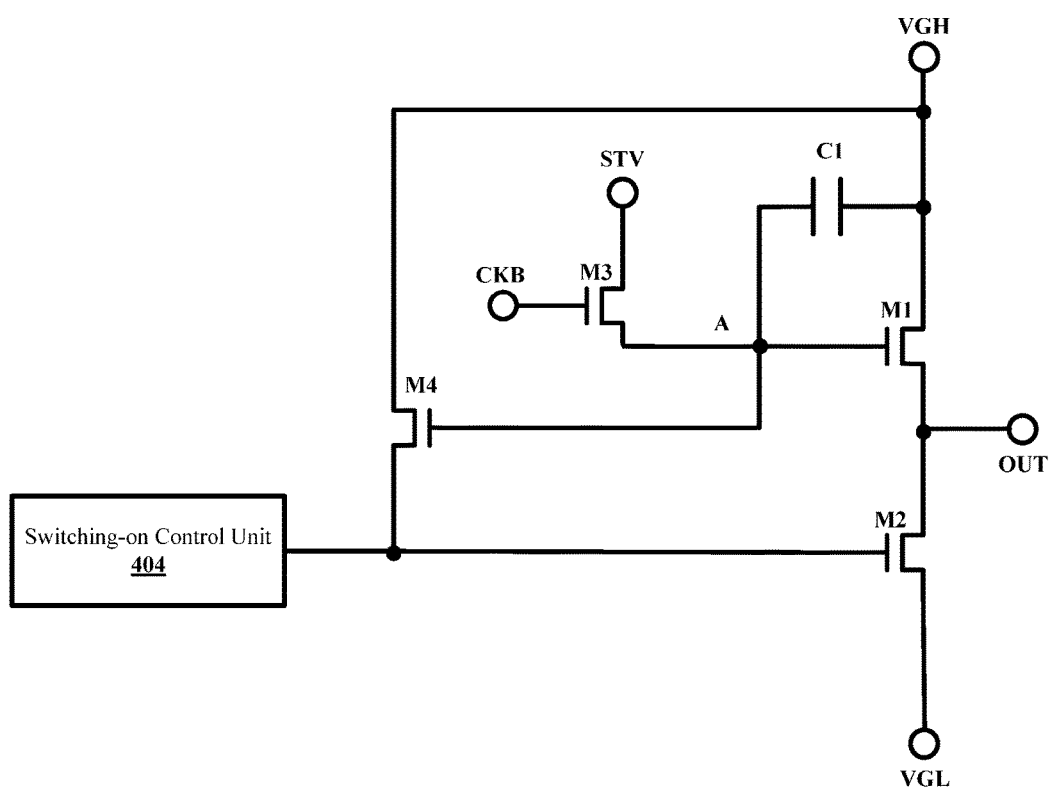
FIG. 5 is a schematic structural view of an example implementation of a switching-off control unit.

As shown in FIG. 5, in order to reduce the number of signals, in an embodiment of the present disclosure, the switching-off control unit includes: a second potential control transistor M4 having the same type as the first output transistor M1. A gate electrode of the second potential control transistor M4 is connected with the second electrode of the first potential control transistor M3 (namely connected to the A node in FIG. 5); a first electrode is connected with the first power node; and a second electrode of the second potential control transistor M4 is connected with the gate electrode of the second output transistor M2.

As the first output transistor M1 and the second potential control transistor M4 are of the same type, the first output transistor M1 and the second potential control transistor M4 are simultaneously switched on. Thus, when M1 is switched on, M4 is also switched on, and a high level signal is outputted to the gate electrode of the second output transistor M2 to control M2 to be switched off. Thus, the function of outputting the high level signal to the gate electrode of M2 to switch off M2 is achieved when M1 is switched on.

Figure 6:
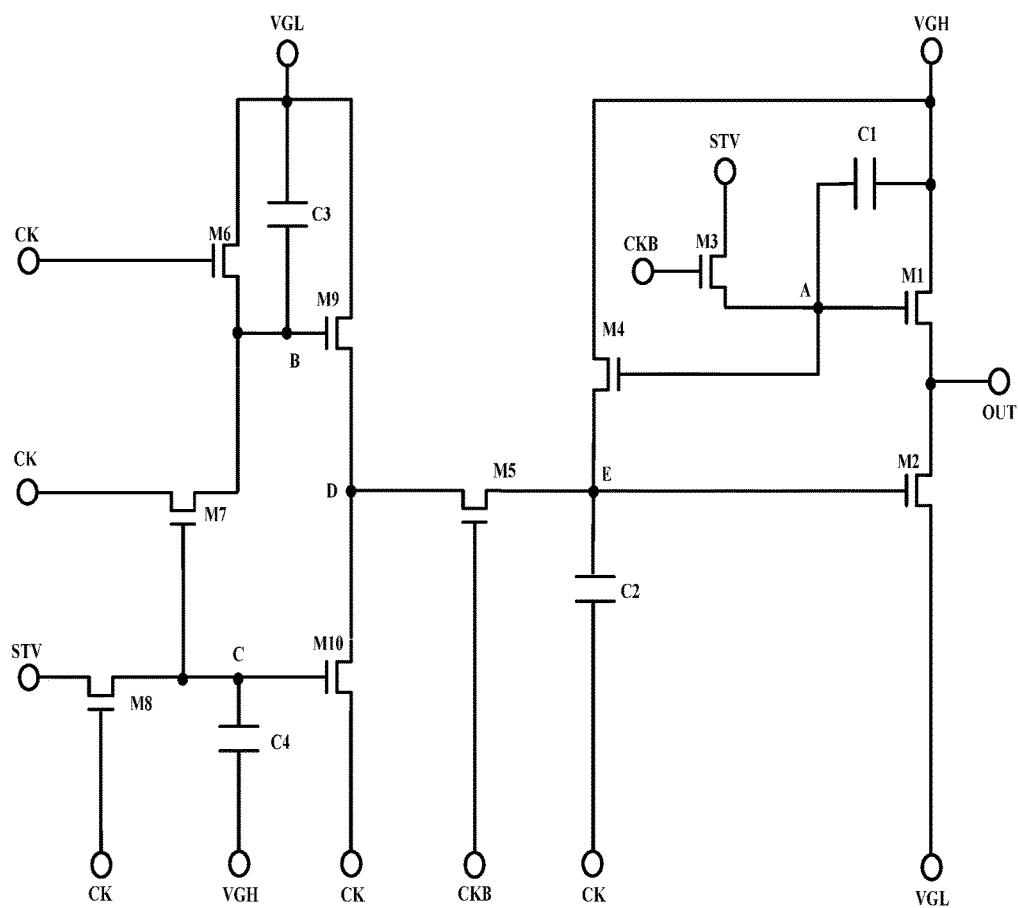
FIG. 6 is a schematic structural view of an example implementation of a switching-on control unit.

In an embodiment of the present disclosure, as shown in FIG. 6, the switching-on control unit includes:

a second capacitor structure C2, in which one end of the second capacitor structure C2 is connected with the gate electrode of the second output transistor M2, and the other end is connected with a second clock node for receiving a second clock signal CK;

a third potential control transistor M5, in which a gate electrode of the third potential control transistor M5 is connected with the first clock node, and a second electrode is connected with the gate electrode of the second output transistor M2;

a fourth potential control transistor M6, in which a gate electrode of the fourth potential control transistor M6 is connected with the second clock node, and a first electrode is connected with the second power node;

a fifth potential control transistor M7, in which a first electrode of the fifth potential control transistor is connected with the second clock node, and a second electrode is connected with a second electrode of the fourth potential control transistor M6;

a sixth potential control transistor M8, in which a gate electrode of the sixth potential control transistor M8 is connected with the second clock node, and a first electrode is connected with a start node for providing the start signal;

a seventh potential control transistor M9, in which a gate electrode of the seventh potential control transistor M9 is connected with the second electrode of the fourth potential control transistor M6; a first electrode is connected with the second power node; a second electrode is connected with a first electrode of the third potential control transistor M5;

an eighth potential control transistor M10, in which a gate electrode of the eighth potential control transistor M10 is connected with a second electrode of the sixth potential control transistor M8; a first electrode is connected with the second clock node; a second electrode is connected with the first electrode of the third potential control transistor M5;

a third capacitor structure C3, in which one end of the third capacitor structure is connected with the gate electrode of the seventh potential control transistor M9, and the other end is connected with the second power node; and a fourth capacitor structure C4, in which one end of the fourth capacitor structure is connected with the gate electrode of the eighth potential control transistor M10, and the other end is connected with the first power node.

It should be understood that: although FIG. 6 illustrates the transistors M3 and M4, the transistors M3 and M4 are only taken as example embodiments of the first-node potential control module and the switching-off control unit, and do not represent the one-to-one correspondence between the transistors M3 and M4 and the switching-on control unit.

Figure 7A:
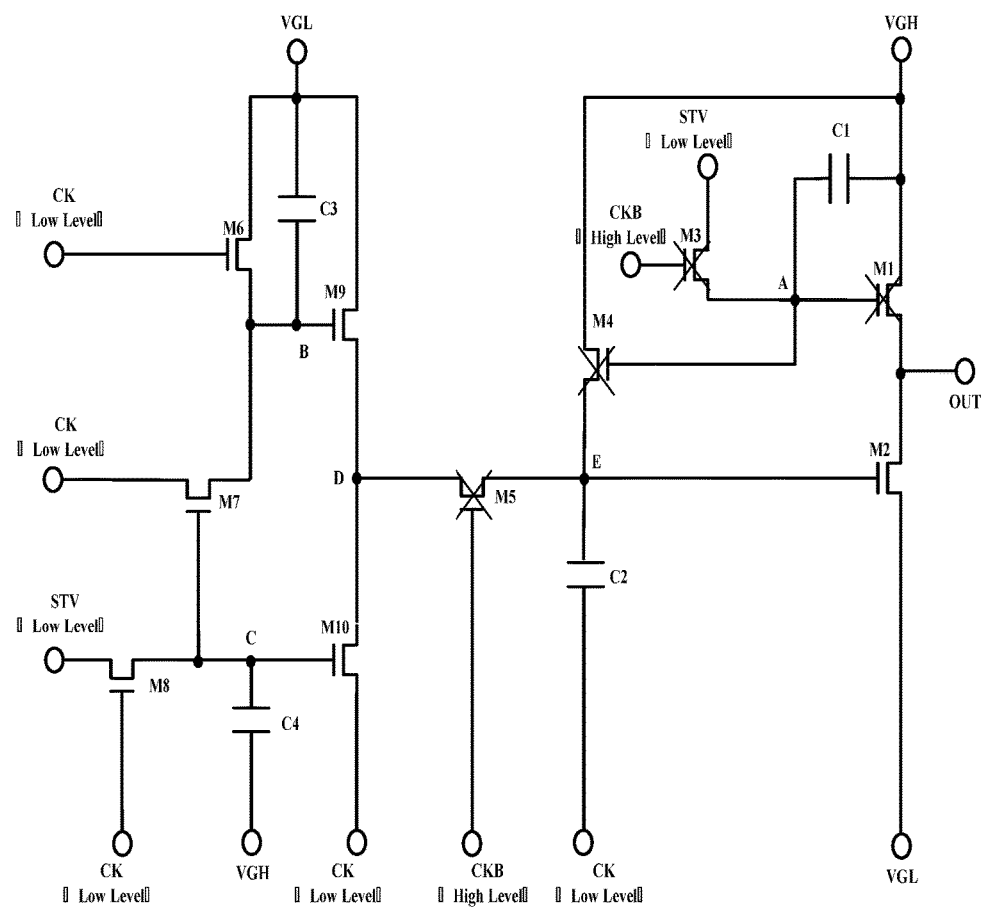
FIGS. 7a to 7d are schematic diagrams of signals and transistor states of the signal generating unit as shown in FIG. 6 at different periods.
Figure 7B:
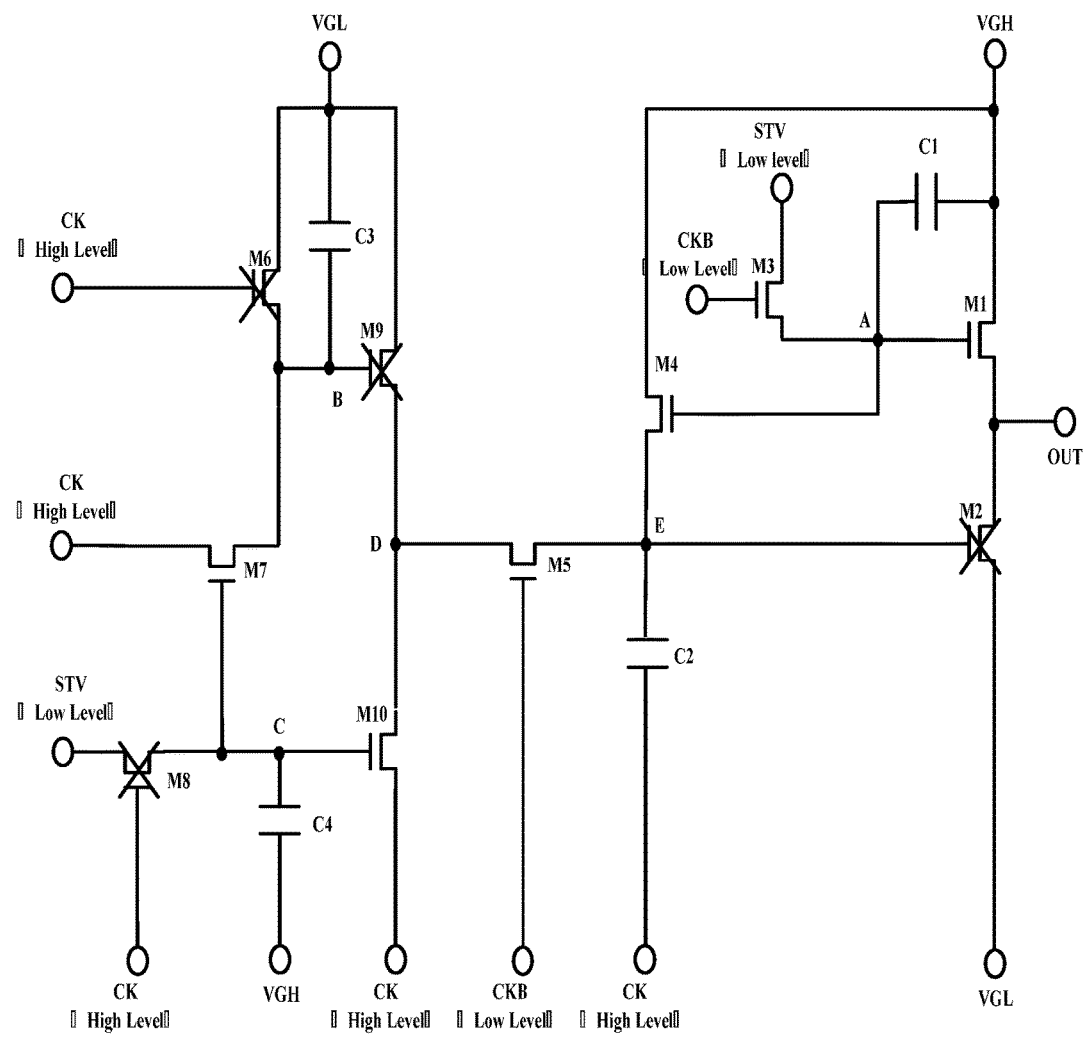
Figure 7C:
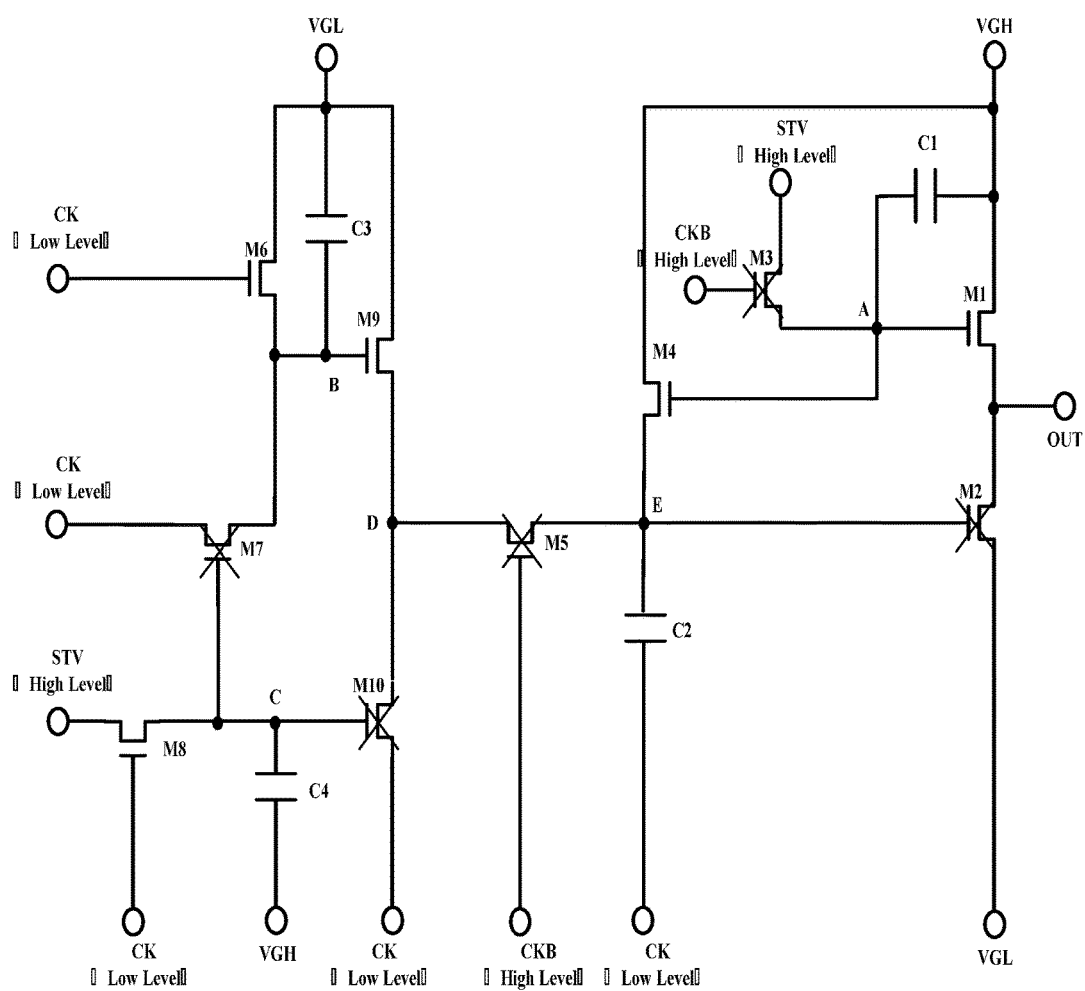
Figure 7D:
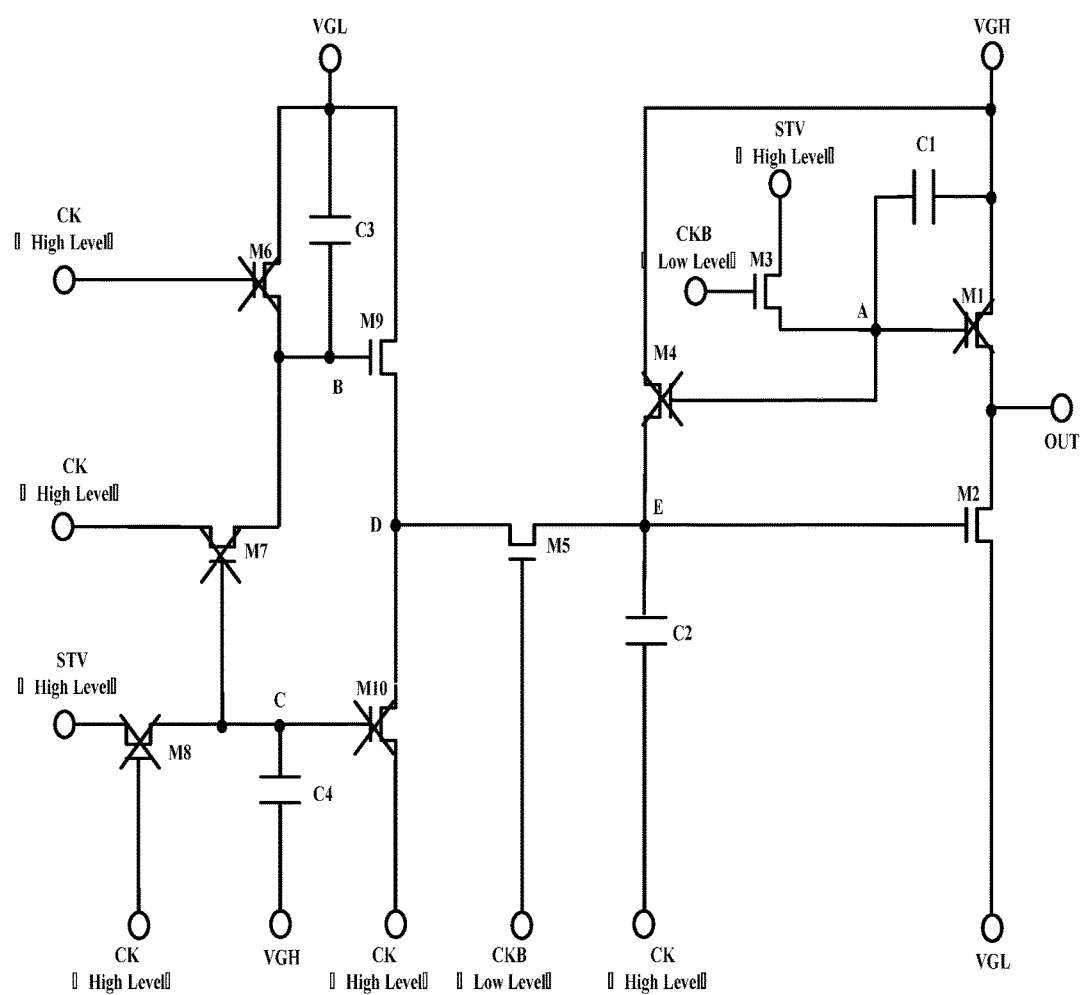
Figure 8:
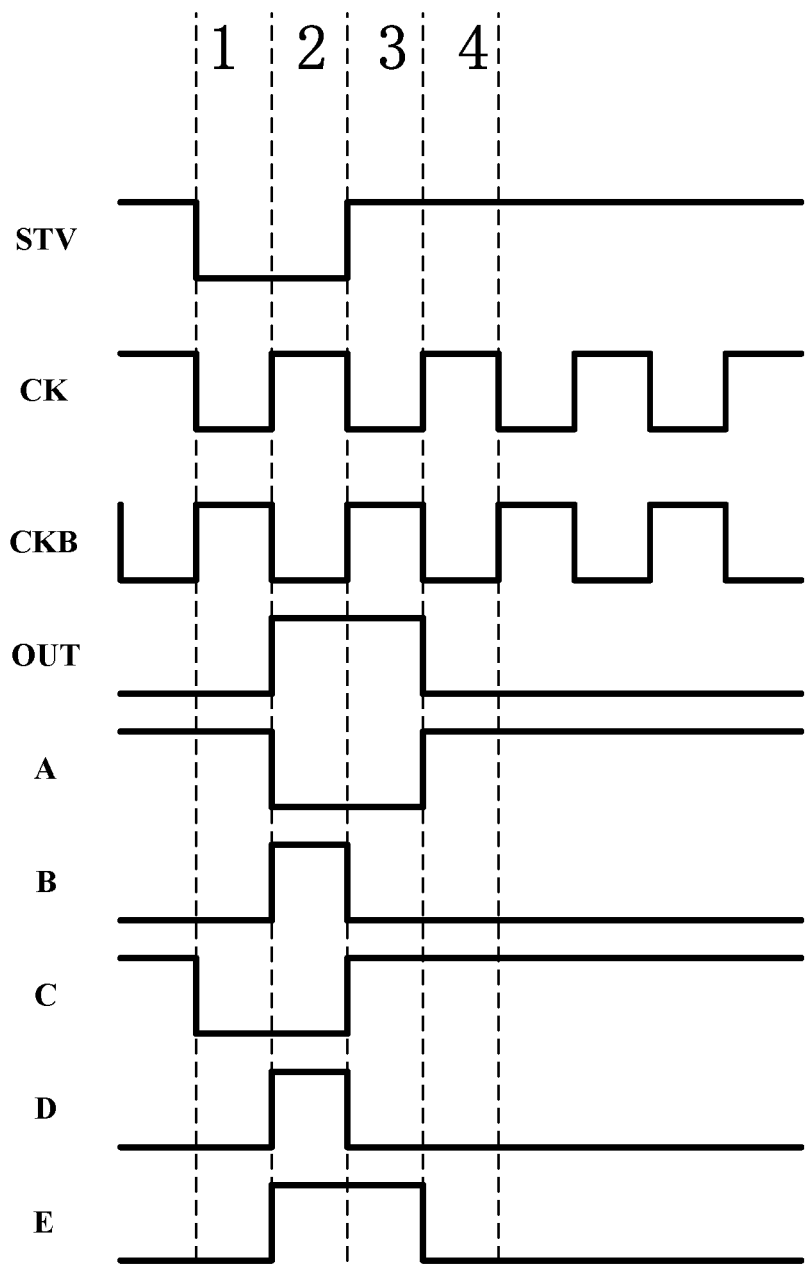
FIG. 8 is a schematic diagram illustrating switching of states of signals and nodes used in the signal generating unit as shown in FIG. 6.

Detailed description will be given below to a specific working process of the signal generating unit provided by the embodiments of the present disclosure with reference to the timing diagram as shown in FIG. 8 and the state diagrams of the transistors as shown in FIGS. 7a to 7d.

As shown in FIG. 8, the operation of the signal generating unit provided by an embodiment of the present disclosure is divided into 4 periods, respectively as follows:

(1) First Period (with Reference to FIG. 7a)

Signals:

STV is a low level signal; CK is a low level signal; CKB is a high level signal.

The states of the transistors under the control of input signals:

M6, M8: on;

M3, M5: off.

Working Process:

as M3 is switched off, the potential of the A node is controlled by C1;

as M5 is switched off, the potential of an E node is controlled by C2;

in the case of no signal input, C1 and C2 have the ability to maintain the potentials at a previous period, so that the potentials of the A node and the E node maintain the states of the last moment. As it can be seen from the design of the Em signal, the A node is in the high level and the E node is in the low level, so that M1 is switched off and M2 is switched on; and the output node OUT outputs a low level signal.

Meanwhile, M8 is switched on and outputs a low level signal to a C node, so that the C node can be in the low level.

(2) Second Period (with Reference to FIG. 7b)

Signals:

STV is a low level signal; CK is a high level signal; CKB is a low level signal.

The states of the transistors under the control of the input signals:

M3, M5: on;

M6, M8: off.

Working Process:

as M3 is switched on, a low level signal is outputted to the A node to control M1 and M4 to be switched on simultaneously, and the conducted M1 outputs a high level signal;

the conducted M4 outputs a high level signal to the E node to switch off M2;

meanwhile, at the previous period, as shown in FIG. 7a, after M8 is switched on, the low level signal is outputted to the C node; after signals are cut off at this period, the C node is in low level due to the potential maintaining ability of C4; and then M7 and M10 are switched on;

after M7 is switched on, a high level signal is outputted to the gate electrode of M9 to switch off M9;

after M10 is switched on, a high level signal is outputted to a D node; the conducted M5 controls the E node to be in high level; and M2 is controlled to be switched off.

(3) Third Period (with Reference to FIG. 7c)

Signals:

STV is a high level signal; CKB is a high level signal; CK is a low level signal.

The states of the transistors under the control of the input signals:

M3, M5: off;

M6, M8: on.

Working Process:

after M3 is switched off, due to the potential maintaining ability of the capacitor C1, the A node is guaranteed to be in the low level continuously. M1 is switched on, and a high level signal is outputted;

M4 is simultaneously switched on when the A node is in low level; a high level signal is outputted to the E node to switch off M2;

after M5 is switched off, the circuit on the left half cannot affect the E node, and no detailed analysis will be given here in the present disclosure.

(4) Fourth Period (with Reference to FIG. 7d)

Signals:

STV is a high level signal; CK is a high level signal; CKB is a low level signal.

The states of the transistors under the control of the input signals:

M3, M5: on;

M6, M8: off.

Working Process:

as M3 is switched on, a high level signal is outputted to the A node to control M1 and M4 to be simultaneously switched off;

the conducted M4 outputs a high level signal to the E node to switch off M2;

due to the potential maintaining ability of C4, the C node still maintains high level at this period, and M7 and M10 are switched off;

due to the potential maintaining ability of C3, the B node still maintains low level at this period, and M9 is switched on; a low level signal is outputted to the D node; the conducted M5 controls the E node to be in low level, and M2 is switched on; and a low level signal is outputted to the output node OUT.

It should be noted that: although the STV signal is a normally high signal with two pulse widths, the normally high signal with two pulse widths at the A node is not obtained by shifting. In consideration of the A node purely, as M3 is switched off at the first period, whether the STV signal is a low level signal or a high level signal at the first period will not affect the A node.

However, the case that the STV signal is a low level signal at the first period is just for a purpose of outputting a low level signal to the C node, and then M7 and M10 are switched on at the second period.

The increase of the pulse width in the embodiments of the present disclosure is described with respect to the following two signals:

the STV low level signal at the second period; and the signal level of the A node at the second period and the third period.

Description is given above by taking the case that a high level signal is outputted at an initial period as an example. But the duty ratio of the Em signal may also be changed by the output of the high level signal at other periods. No further description will be given here.

As described above, the embodiments of the present disclosure can achieve the output of high level signals with different multiples of the pulse width by repeating the signal inputs at the second period and the third period. No further description will be given here.

Figure 9:
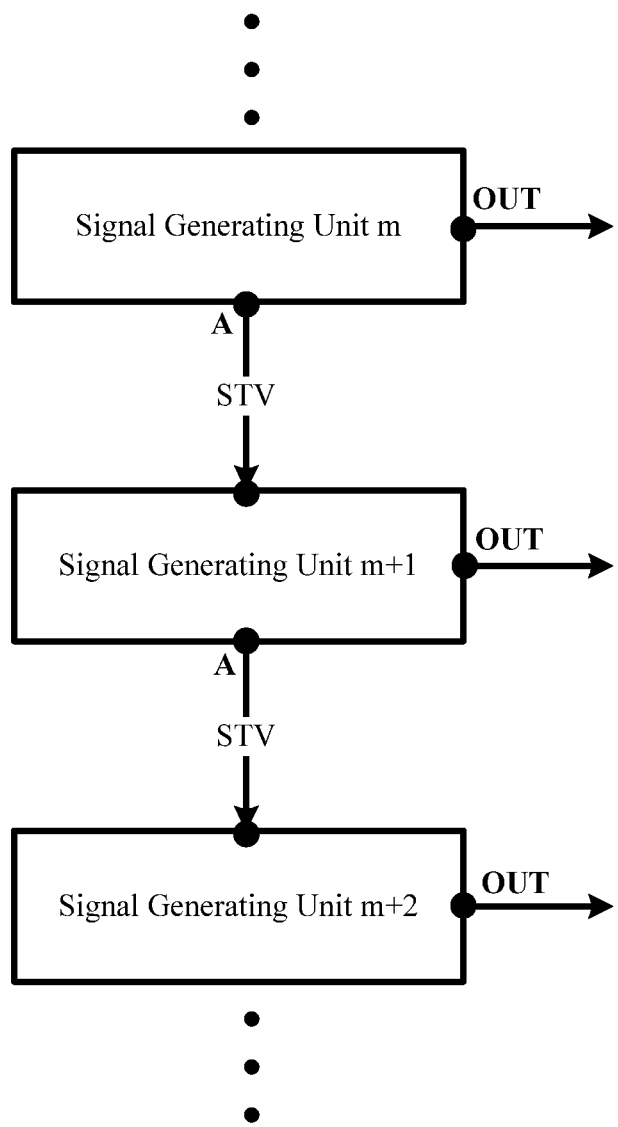
FIG. 9 is a schematic diagram of a shift register formed by signal generating units.

As described above, in the embodiments of the present disclosure, the above signal may be taken as the Em signal of the pixel structure. The Em signal has a shifting property. That is, Em signals in adjacent stages of pixel structures are distributed in misaligned mode. Therefore, the signal generating unit provided by the embodiments of the present disclosure may be in cascade connection to form a shift register to generate Em signals of a display device. For instance, as shown in FIG. 9, in adjacent shift registers, a gate electrode of a first output transistor in a former shift register is connected with a start signal input node of a latter shift register.

Figure 10:
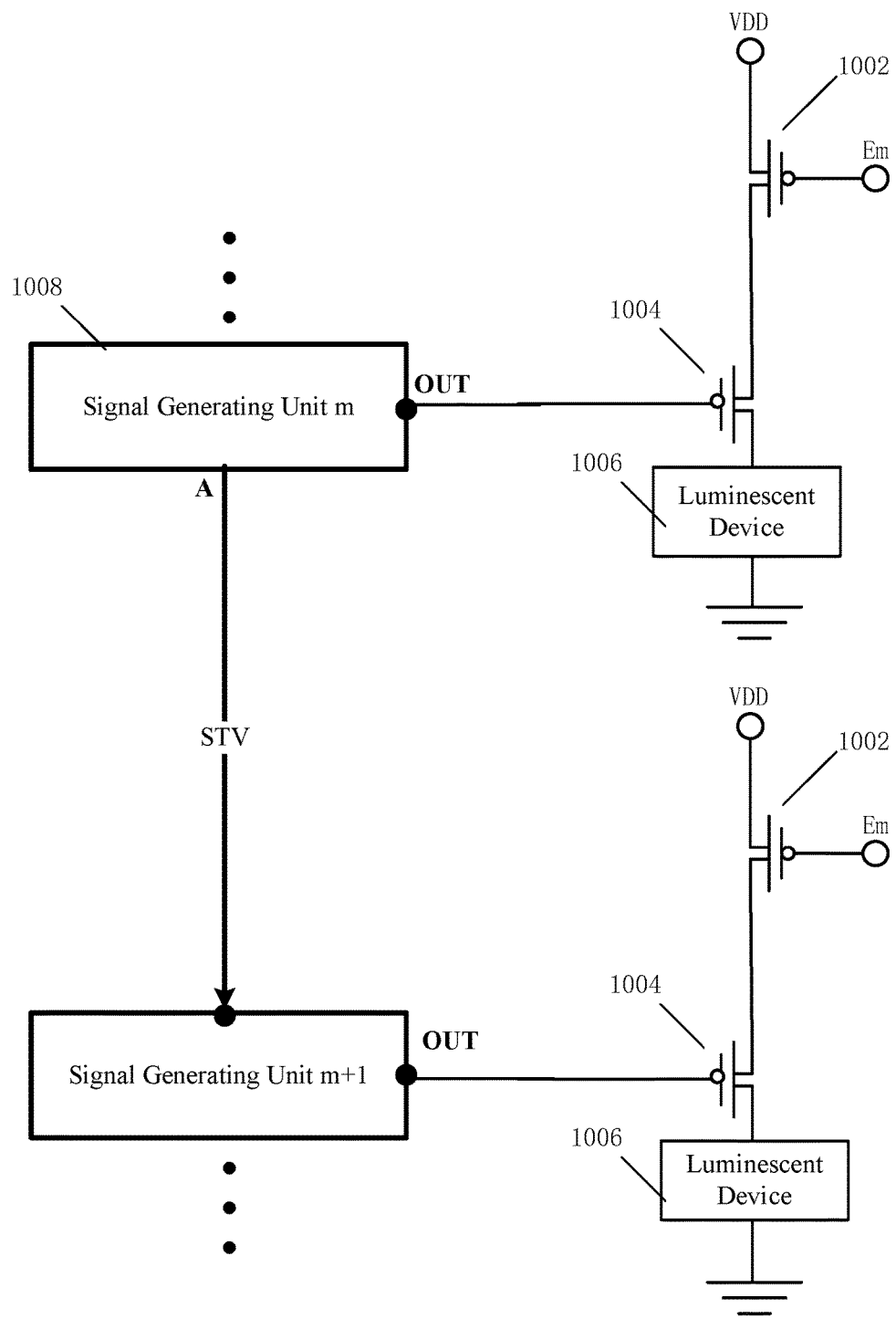
FIG. 10 is a schematic structural partial view of a display device provided by an embodiment of the present disclosure.

An embodiment of the present disclosure further provides a display device. As illustrated in FIG. 10, the display device comprises a plurality of pixel structures disposed in a display region. Each pixel structure includes a driving transistor 1004, a power supply signal input node VDD, a luminescent device 1006 and a power supply control transistor 1002 disposed between the power supply signal input node VDD and the luminescent device 1006. The display device further comprises the foregoing shift register. An output node OUT of each signal generating unit 1008 in the shift register is connected with a gate electrode of a driving transistor 1004 in a corresponding pixel structure.

An embodiment of the present disclosure further provides a signal generating method, which comprises:

under the control of a start signal, outputting a first control signal to a gate electrode of a first output transistor, which is disposed between an output node OUT and a first power node for receiving a high level power supply signal VGH, and outputting a second control signal, which has an opposite phase with the first control signal, to a gate electrode of a second output transistor disposed between the output node and a second power node for receiving a low level power supply signal VGL;

when the first control signal is a single-pulse-width level signal for controlling the first output transistor to switch on, charging a first capacitor structure C1, so that the charged capacitor structure C1 can maintain the gate electrode of the first output transistor in the switching-on state in a subsequent time period having one pulse width.

In the signal generating method, both the first output transistor M1 and the second output transistor M2 are transistors which are switched on under low-level control signals; and the single-pulse-width level signal for controlling the conduction of the first output transistor is a low level signal having a single pulse width.

In the signal generating method, the first control signal outputted in the process of processing one frame of data includes a plurality of single-pulse-width low level signals; and one pulse width is spaced between two adjacent low level signals.

The transistors adopted in the embodiments of the present disclosure may be thin-film transistors (TFTs), field effect transistors (FETs) or similar triodes with other characteristics. As the first electrode and the second electrode of the adopted transistor are symmetrical, the first electrode and the second electrode of the transistor have no difference.

Description is given in the above embodiments by taking P-type transistors as an example, in which the transistors are switched on when the gate electrodes are inputted with low level signals. An N-type transistor is opposite to this. According to the above description, it is conceivable that embodiments adopting N-type transistors may be easily thought of by those skilled in the art without creative efforts and then shall also fall within the scope of protection of the embodiments of the present disclosure.

It's to be noted that, in the drawings, for the clarity of the drawings the sizes of layers and areas may be exaggerated. And it can be understood, in the case that a component or a layer called "on" another element or layer, it can be directly on the top of the other elements, or can exist in the middle layer. Besides, it can be understood that, in the case that a component or a layer called "under" another element or layer, it can be directly under the other components, or there are at least two intermediate layers or elements. Besides, it can also be understood that, in the case that a layer or a component called "between" two layers or two elements, it can be the only layer of the two layers or two components, or it also exists at least two intermediate layers or elements. The similar reference marks indicate similar components in the whole text.

In the present disclosure, terms such as "first", "second" and the like used in the present disclosure do not indicate any sequence, quantity or significance but only for distinguishing different constituent parts. Also, the terms such as "a," "an," or "the" etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects.

It is noted that, azimuth or positional relationships indicated by terms such as "up" and "down" and so on, are azimuth or positional relationships based on the drawings, which are only to facilitate description of the embodiments of the present disclosure and simplify the description, but not to indicate or imply that the devices or components must have a specific azimuth, or be constructed or operated in the specific azimuth, which thus cannot be understood as a limitation to the embodiments of the present disclosure. Unless otherwise clearly defined and limited, terms such as "installed", "coupled", "connected" should be broadly interpreted, for example, it may be fixedly connected, or may be detachably connected, or integrally connected; it may be mechanically connected, or may be electrically connected; it may be directly connected, or may be indirectly connected via an intermediate medium. Those skilled in the art can understand the specific meanings of the above-mentioned terms in the embodiments of the present disclosure according to the specific circumstances.

What are described above is related to the illustrative embodiments of the disclosure only and not limitative to the scope of the disclosure; any changes or replacements easily for those technical personnel who are familiar with this technology in the field to envisage in the scopes of the disclosure, should be in the scope of protection of the present disclosure. Therefore, the scopes of the disclosure are defined by the accompanying claims.

The present application claims the priority of the Chinese Patent Application No. 201610091556.5 filed on Feb. 18, 2016, which is incorporated herein by reference in its entirety as part of the disclosure of the present application.

What is claimed is:

1. A signal generating unit, comprising:
    a first output transistor disposed between an output node and a first power node, the first power node configured for receiving a high-level power supply signal, a gate electrode of the first output transistor coupled to a first node;
    a second output transistor disposed between the output node and a second power node, the second power node configured for receiving a low-level power supply signal, a gate electrode of the second output transistor coupled to a second node;
    a first-node potential control module, coupled to the first node and configured to output a start signal to the first node;
    a second-node potential control module coupled to the second node, the second-node potential control module including a switching-off control unit configured to switch off the second output transistor when the first output transistor is switched on; and
    a first capacitor structure connected with the gate electrode of the first output transistor, and configured to be charged when the first-node potential control module outputs a single-pulse-width level signal for controlling the first output transistor to be switched on, and to maintain the gate electrode of the first output transistor in an on state during a subsequent time period having one pulse width, wherein:
    the switching-off control unit includes a second potential control transistor, a gate electrode of the second potential control transistor is coupled to the first node, a first electrode of the second potential control transistor is directly connected with the first power node to receive the high-level power supply signal, and a second electrode of the second potential control transistor is coupled to the second node to be connected with the gate electrode of the second output transistor.

2. The signal generating unit according to claim 1, wherein both the first output transistor and the second output transistor are transistors which are switched on under low-level control signals; and the single-pulse-width level signal for controlling the first output transistor to be switched on, which is outputted by the first-node potential control module, is a single-pulse-width low level signal.

3. The signal generating unit according to claim 2, wherein the start signal includes a plurality of single-pulse-width low level signals, and two adjacent single-pulse-width low level signals are separated by a duration of one pulse width.

4. The signal generating unit according to claim 2, wherein:
    the first-node potential control module includes a first potential control transistor;
    a gate electrode of the first potential control transistor is connected with a first clock node for receiving a first clock signal, a first electrode receives the start signal including the single-pulse-width low level signal, and a second electrode is coupled to the first node to be connected with the gate electrode of the first output transistor; and
    the first clock signal controls the first potential control transistor to be switched on, when the first electrode of the first potential control transistor receives the single-pulse-width low level signal.

5. The signal generating unit according to claim 2, wherein the second-node potential control module further includes:
    a switching-on control unit configured to output a low level signal to the gate electrode of the second output transistor to switch on the second output transistor, when the first output transistor is switched off,
    wherein the switching-off control unit is configured to output a high level signal to the gate electrode of the second output transistor to switch off the second output transistor, when the first output transistor is switched on.

6. The signal generating unit according to claim 5, wherein:
    the second potential control transistor is of a same type as the first output transistor; and
    the gate electrode of the second potential control transistor is connected with the second electrode of the first potential control transistor.

7. The signal generating unit according to claim 6, wherein the switching-on control unit includes:
    a second capacitor structure, in which one end of the second capacitor structure is connected with the gate electrode of the second output transistor, and another end is connected with a second clock node for receiving a second clock signal;

a third potential control transistor, in which a gate electrode of the third potential control transistor is connected with the first clock node, and a second electrode is connected with the gate electrode of the second output transistor;

a fourth potential control transistor, in which a gate electrode of the fourth potential control transistor is connected with the second clock node, and a first electrode is connected with the second power node;

a fifth potential control transistor, in which a first electrode of the fifth potential control transistor is connected with the second clock node, and a second electrode is connected with a second electrode of the fourth potential control transistor;

a sixth potential control transistor, in which a gate electrode of the sixth potential control transistor is connected with the second clock node, and a first electrode is connected with a start node for providing the start signal;

a seventh potential control transistor, in which a gate electrode of the seventh potential control transistor is connected with the second electrode of the fourth potential control transistor, a first electrode is connected with the second power node, and a second electrode is connected with a first electrode of the third potential control transistor;

an eighth potential control transistor, in which a gate electrode of the eighth potential control transistor is connected with a second electrode of the sixth potential control transistor; a first electrode is connected with the second clock node, and a second electrode is connected with the first electrode of the third potential control transistor;

a third capacitor structure, in which one end of the third capacitor structure is connected with the gate electrode of the seventh potential control transistor, and another end is connected with the second power node; and a fourth capacitor structure, in which one end of the fourth capacitor structure is connected with the gate electrode of the eighth potential control transistor, and another end is connected with the first power node.

8. A shift register, comprising a plurality of signal generating units, each of the plurality of signal generating units being implemented based on the signal generating unit according to claim 1, wherein the plurality of signal generating units are in cascade connection to form the shift register, and in adjacent signal generating units, a gate electrode of a first output transistor in a former signal generating unit is connected with a start signal input node of a latter signal generating unit.

9. A display device, comprising a plurality of pixel structures disposed in a display region, wherein each pixel structure includes a driving transistor, a power supply signal input node, a luminescent device and a power supply control transistor disposed between the power supply signal input node and the luminescent device, and the display device further comprises the shift register according to claim 8, and an output node of each signal generating unit in the shift register is connected with a gate electrode of a driving transistor in a corresponding pixel structure.

10. A signal generating method performed by the signal generating unit according to claim 1, comprising:
providing a start signal to a first node and then to a gate electrode of a first output transistor, wherein the first output transistor is disposed between an output node and a first power node for receiving a high level power supply signal, and a second output transistor is disposed between the output node and a second power node for receiving a low level power supply signal; and charging a first capacitor structure when the start signal includes a single-pulse-width level signal for controlling the first output transistor to be switched on, so that the charged first capacitor structure maintains the gate electrode of the first output transistor in an on state during a subsequent time period having a duration of one pulse width.

11. The signal generating method according to claim 10, wherein both the first output transistor and the second output transistor are transistors which are switched on under low-level control signals, and the single-pulse-width level signal for controlling the first output transistor to be switched on is a single-pulse-width low level signal.

12. The signal generating method according to claim 11, wherein the start signal includes a plurality of single-pulse-width low level signals in a process of processing one frame of data, and adjacent single-pulse-width low level signals are separated by a duration of one pulse width.

13. The signal generating unit according to claim 3, wherein:
the first-node potential control module includes a first potential control transistor;
a gate electrode of the first potential control transistor is connected with a first clock node for receiving a first clock signal, a first electrode receives the start signal including the single-pulse-width low level signal, and a second electrode is connected with the gate electrode of the first output transistor; and
the first clock signal controls the first potential control transistor to be switched on, when the first electrode of the first potential control transistor receives the single-pulse-width low level signal.

14. The signal generating unit according to claim 3, wherein the second-node potential control module includes:
a switching-off control unit configured to output a high level signal to the gate electrode of the second output transistor to switch off the second output transistor, when the first output transistor is switched on; and
a switching-on control unit configured to output a low level signal to the gate electrode of the second output transistor to switch on the second output transistor, when the first output transistor is switched off.

15. A signal generating unit, comprising:
a first output transistor disposed between an output node and a first power node, the first power node configured for receiving a high-level power supply signal;
a second output transistor disposed between the output node and a second power node, the second power node configured for receiving a low-level power supply signal;
a first-node potential control module, configured to output a first control signal to a gate electrode of the first output transistor under control of an inputted start signal;
a second-node potential control module configured to output a second control signal, which has an opposite phase with the first control signal, to a gate electrode of the second output transistor; and
a first capacitor structure connected with the gate electrode of the first output transistor, and configured to be charged when the first-node potential control module outputs a single-pulse-width level signal for controlling the first output transistor to be switched on, and to maintain the gate electrode of the first output transistor in an on state during a subsequent time period having one pulse width, wherein:

both the first output transistor and the second output transistor are transistors which are switched on under low-level control signals; and the single-pulse-width level signal for controlling the first output transistor to be switched on, which is outputted by the first-node potential control module, is a single-pulse-width low level signal;

the second-node potential control module includes:
   a switching-off control unit configured to output a high level signal to the gate electrode of the second output transistor to switch off the second output transistor, when the first output transistor is switched on; and
   a switching-on control unit configured to output a low level signal to the gate electrode of the second output transistor to switch on the second output transistor, when the first output transistor is switched off;

the switching-off control unit includes: a second potential control transistor having a same type as the first output transistor;

a gate electrode of the second potential control transistor is connected with the second electrode of the first potential control transistor, a first electrode of the second potential control transistor is connected with the first power node, and a second electrode of the second potential control transistor is connected with the gate electrode of the second output transistor; and the switching-on control unit includes:
   a second capacitor structure, in which one end of the second capacitor structure is connected with the gate electrode of the second output transistor, and another end is connected with a second clock node for receiving a second clock signal;
   a third potential control transistor, in which a gate electrode of the third potential control transistor is connected with the first clock node, and a second electrode is connected with the gate electrode of the second output transistor;
   a fourth potential control transistor, in which a gate electrode of the fourth potential control transistor is connected with the second clock node, and a first electrode is connected with the second power node;
   a fifth potential control transistor, in which a first electrode of the fifth potential control transistor is connected with the second clock node, and a second electrode is connected with a second electrode of the fourth potential control transistor;
   a sixth potential control transistor, in which a gate electrode of the sixth potential control transistor is connected with the second clock node, and a first electrode is connected with a start node for providing the start signal;
   a seventh potential control transistor, in which a gate electrode of the seventh potential control transistor is connected with the second electrode of the fourth potential control transistor, a first electrode is connected with the second power node, and a second electrode is connected with a first electrode of the third potential control transistor;
   an eighth potential control transistor, in which a gate electrode of the eighth potential control transistor is connected with a second electrode of the sixth potential control transistor; a first electrode is connected with the second clock node, and a second electrode is connected with the first electrode of the third potential control transistor;
   a third capacitor structure, in which one end of the third capacitor structure is connected with the gate electrode of the seventh potential control transistor, and another end is connected with the second power node; and
   a fourth capacitor structure, in which one end of the fourth capacitor structure is connected with the gate electrode of the eighth potential control transistor, and another end is connected with the first power node.

* * * * *